(12) United States Patent
Wang et al.

(10) Patent No.: US 11,754,614 B2
(45) Date of Patent: Sep. 12, 2023

(54) SEMICONDUCTOR DEVICE AND ANALYZING METHOD THEREOF

(71) Applicant: TAIWAN SEMICONDUCTOR MANUFACTURING COMPANY LTD., Hsinchu (TW)

(72) Inventors: Wei-Jhih Wang, Hsinchu (TW); Chia Wei Huang, Hsinchu (TW); Chia-Chia Kan, Taipei (TW); Yuan-Yao Chang, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/246,071

(22) Filed: Apr. 30, 2021

(65) Prior Publication Data

US 2022/0349932 A1    Nov. 3, 2022

(51) Int. Cl.
| | |
|---|---|
| *G01R 31/26* | (2020.01) |
| *H01L 27/088* | (2006.01) |
| *G01R 19/165* | (2006.01) |
| *H01L 23/528* | (2006.01) |
| *G01R 19/10* | (2006.01) |
| *H10B 10/00* | (2023.01) |

(52) U.S. Cl.
CPC ......... *G01R 31/2601* (2013.01); *G01R 19/10* (2013.01); *G01R 19/165* (2013.01); *H01L 23/5286* (2013.01); *H01L 27/0886* (2013.01); *H10B 10/12* (2023.02)

(58) Field of Classification Search
CPC .. G01R 31/2601; G01R 19/10; G01R 19/165; H01L 23/5286; H01L 27/0886; H01L 27/1104
See application file for complete search history.

(56) References Cited

U.S. PATENT DOCUMENTS

| | | | | |
|---|---|---|---|---|
| 6,252,427 | B1 * | 6/2001 | Domae ................. | H01L 27/092 326/122 |
| 8,853,787 | B2 * | 10/2014 | Cha ....................... | H01L 27/088 257/E27.06 |
| 2008/0054943 | A1 * | 3/2008 | Ramaraju ............ | H03K 19/017 326/83 |
| 2013/0163330 | A1 * | 6/2013 | Sharon ................ | G06F 11/1072 365/185.17 |
| 2014/0151793 | A1 * | 6/2014 | Cha ................... | H01L 29/42356 257/288 |

(Continued)

*Primary Examiner* — Akm Zakaria
(74) *Attorney, Agent, or Firm* — WPAT LAW; Anthony King

(57) ABSTRACT

The present disclosure provides a method of analyzing a semiconductor device. The method includes providing a first transistor, a second transistor disposed adjacent to the first transistor, and a gate electrode common to the first transistor and the second transistor; connecting a power-supply voltage ($V_{dd}$) to the gate electrode to turn on the first transistor, determining a first threshold voltage ($V_{th}$) based on the power-supply voltage; switching the power-supply voltage to a ground voltage ($V_{ss}$); connecting the ground voltage to the gate electrode to turn on the second transistor; and determining a second threshold voltage based on the ground voltage.

20 Claims, 12 Drawing Sheets

(56) References Cited

U.S. PATENT DOCUMENTS

| | | | | |
|---|---|---|---|---|
| 2015/0102415 | A1* | 4/2015 | Hwang | H01L 27/0207 |
| | | | | 257/369 |
| 2016/0351569 | A1* | 12/2016 | Song | H01L 27/092 |
| 2017/0229462 | A1* | 8/2017 | Kim | H01L 27/0922 |
| 2017/0287567 | A1* | 10/2017 | Cai | G11C 29/50004 |
| 2020/0386797 | A1* | 12/2020 | Stark | G01R 19/16538 |
| 2021/0028304 | A1* | 1/2021 | Jeong | H01L 21/76895 |

* cited by examiner

SEMICONDUCTOR DEVICE AND ANALYZING METHOD THEREOF

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection, and low testing coverage. Therefore, there is a continuous need to modify the structure and manufacturing method of the devices in electronic equipment in order to decrease device size while reducing manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
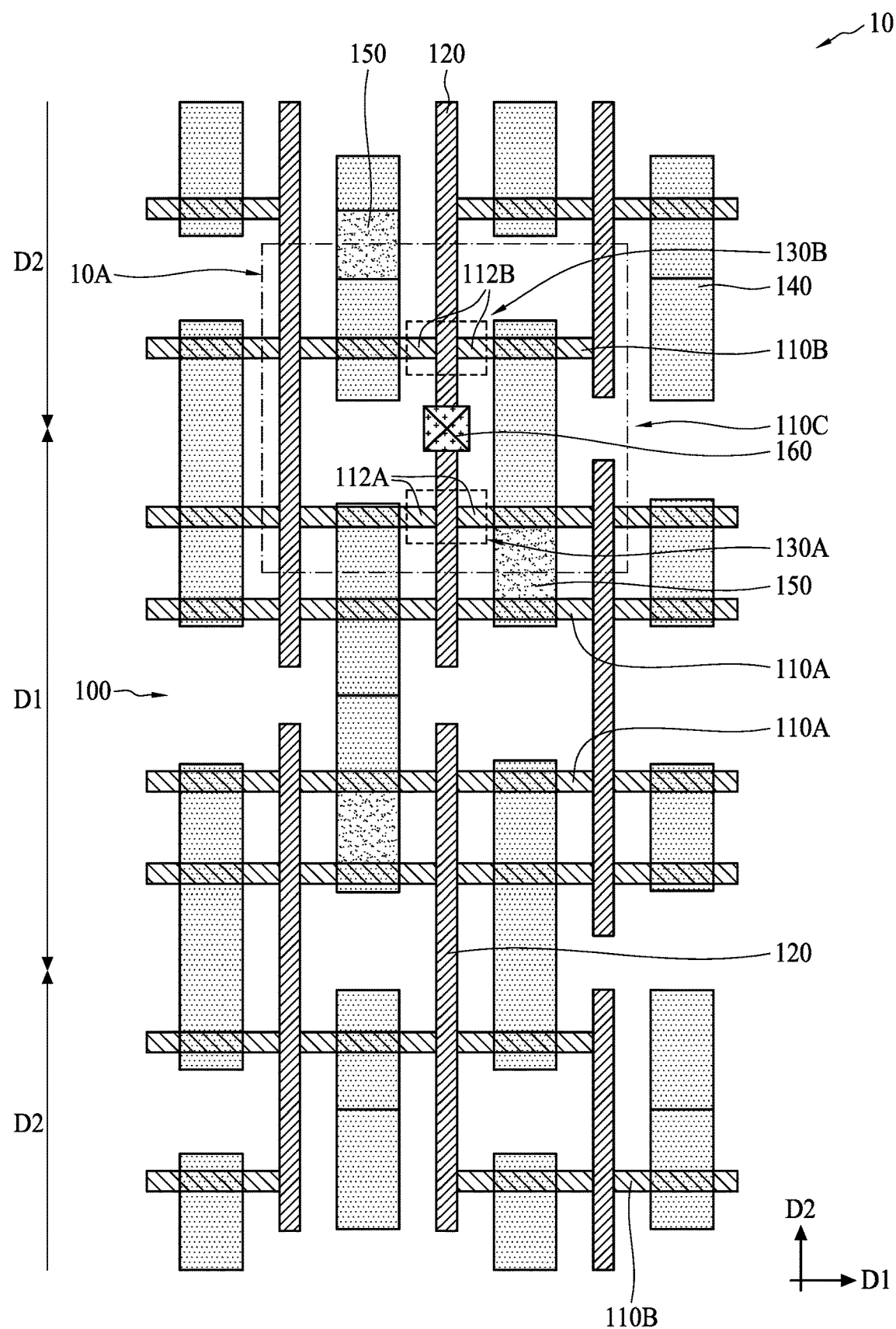
FIG. 1 is a layout of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor fabrication processes may involve filling high aspect-ratio (AR) trenches with an insulating material or a conductive material. As the semiconductor device geometry continues to decrease, the void-free filling of high aspect-ratio trenches becomes increasingly difficult due to limitations of existing deposition processes.

In the fabrication of a fin-type FET (FinFET) device, a gate-all-around (GAA) device or a nanowire device, a PMOS transistor and an NMOS transistor of the device may be formed by performing a CMOS process including a replacement poly gate (RPG) process (or a gate-last process). In the RPG process, a dummy poly gate is initially formed in a semiconductor device. The semiconductor device may continue with the CMOS process to form various features such as lightly doped drain (LDD) regions, sidewall spacers, source/drain (S/D) regions, resist protective oxide (RPO), silicide features, contact etch stop layer (CESL) or the like, concluding with the deposition of an interlayer dielectric (ILD) layer by a high density plasma (HDP) deposition process or other suitable technique. A chemical mechanical polishing (CMP) process may be performed on the ILD layer to expose the dummy poly gate.

The dummy poly gate may then be removed by an etch back process, thereby forming a trench. The trench may be filled with one or more metal layers, and the metal layer is then planarized. Accordingly, the dummy poly gate is replaced with a metal gate.

In some cases, some fabrication problems may occur in the RPG process. For example, the trench formed by removing the dummy poly gate by the etch back process may not have an appropriate profile. In another example, the trench filled with the metal layer may have voids or gaps.

These kinds of fabrication problems are related to metal-depositing problems and may be categorized into different defects. These defects may result in significant electrical failure of a semiconductor device and even a low-yield wafer. However, metal-depositing problems are not easy to precisely detect using routine wafer acceptance tests (WAT) such as measurement of a linear threshold voltage ($V_{th1}$) or a saturation drain current ($I_{dsat}$).

Therefore, the present disclosure provides a semiconductor device and a method for analyzing the semiconductor device.

FIG. 1 is a layout of a semiconductor device 10, in accordance with some embodiments of the present disclosure. Some components of the semiconductor device 10 are not shown for purposes of clarity. In some embodiments, the semiconductor device 10 may be a memory cell used in a static random access memory (SRAM). The semiconductor device 10 includes a first region D1 and a second region D2 alternately arranged on a substrate 100.

The substrate 100 may be formed of a silicon substrate or another suitable semiconductor substrate. In some embodiments, a plurality of first active regions 110A are disposed in the first region D1, and a plurality of second active regions 110B are disposed in the second region D2. In some embodiments, the first active region 110A and the second active region 110B extend along a first direction D1 on the substrate 100. In some embodiments, the first active regions 110A have various lengths along the first direction D1. In some embodiments, the second active regions 110B have various lengths along the first direction D1.

In some embodiments, each of the first active regions 110A and each of the second active regions 110B are laterally surrounded by an isolation structure 110C. The isolation structure 110C is formed of dielectric materials such as oxide or nitride, and may be referred to as a shallow trench isolation (STI). In some embodiments, the first active regions 110A are separated from the second active regions 110B by the isolation structure 110C. In some embodiments, the first active region 110A is surrounded by the isolation structure 110C. In some embodiments, the second active region 110B is surrounded by the isolation structure 110C.

The first active region 110A and the second active region 110B are oxide definition (OD) regions. In some embodiments, the first active region 110A has a first conductive type, and the second active region 110B has a second conductive type different from the first conductive type. In some embodiments, the first conductive type is N type, and the second conductive type is P type. In such embodiments, when the first conductive type is N type, the first active region 110A is an N-type active region doped with N-type impurities such as phosphorus (P), arsenic (As), or the like. In other embodiments, the first conductive type is P type, and the second conductive type is N type. In such embodiments, when the first conductive type is P type, the first active region 110A is a P-type active region doped with P-type impurities such as boron (B), gallium (Ga), indium (In) or the like.

In some embodiments, a plurality of gate electrodes 120 are disposed over the first active regions 110A, the isolation structures 110C and the second active regions 110B. In some embodiments, some of the gate electrodes 120 are disposed over both the first active regions 110A and the second active regions 110B. In some embodiments some of the gate electrodes 120 are only disposed over the first active regions 110A. In some embodiments, some of the gate electrodes 120 are only disposed over the second active regions 110B. In some embodiments, the gate electrode 120 extends along a second direction D2 substantially perpendicular to the first direction D1.

In some embodiments, the gate electrode 120 is formed of a conductive material, such as doped polysilicon, or formed of a metal gate comprising metallic materials such as tungsten and cobalt, and other work function adjusting metals, such as Ti, Al, TiAl, TiN, TaC, and the like. Although not explicitly shown, the first active region 110A and the second active region 110B include a plurality of source/drain (S/D) regions. In some embodiments, a portion of the first active region 110A on two sides of the gate electrode 120 from a top view is a first S/D region 112A. In some embodiments, a portion of the second active region 110B on two sides of the gate electrode 120 from a top view is a second S/D region 112B. In some embodiments, the first S/D region 112A is defined in the first active region 110A according to a concentration level of the N-type dopants implanted in the first active region 110A. In some embodiments, the second S/D region 112B is defined in the second active region 110B according to a concentration level of the P-type dopants implanted in the second active region 110B.

In some embodiments, the first S/D region 112A and the gate electrode 120 forms an NMOS transistor, as encircled by a dashed line 130A. The first S/D region 112A serves as a source terminal and a drain terminal of the NMOS transistor 130A. The gate electrode 120 serves as a gate terminal of the NMOS transistor 130A. In some embodiments, the second S/D region 112B and the gate electrode 120 forms a PMOS transistor 130B, as encircled by a dashed line 130B. The second S/D region 112B serves as a source terminal and a drain terminal of the PMOS transistor 130B. The gate electrode 120 serves as a gate terminal of the PMOS transistor 130B.

In some embodiments, the gate electrode 120 is common to the NMOS transistor 130A and the PMOS transistor 130B. In other words, the NMOS transistor 130A and the PMOS transistor 130B share a same gate electrode 120. In some embodiments, a channel region (not shown), which is undoped or lightly doped, is interposed between the first S/D region 112A and the gate electrode 120 in the NMOS transistor 130A from a top view. In addition, another channel region is interposed between the second S/D region 112B and the gate electrode 120 in the PMOS transistor 130B from a top view.

In some embodiments, a plurality of first conductive members 140 are disposed over the first active regions 110A and the second active regions 110B. In some embodiments, some of the first conductive members 140 are disposed over both the first active regions 110A and the second active regions 110B. In some embodiments, some of the first conductive members 140 are only disposed over the first active regions 110A. In some embodiments, some of the first conductive members 140 are only disposed over the second active regions 110B. In some embodiments, the gate electrodes 120 and the first conductive members 140 are alternately arranged along the first direction D1. In some embodiments, the first conductive members 140 extend along the second direction D2 and are parallel to each other. In some embodiments, the first conductive member 140 is spaced away from the gate electrode 120.

In some embodiments, a second conductive member 150 is disposed on one of the first conductive members 140. In some embodiments, a common conductive member 160 is disposed on the gate electrode 120. In some embodiments, the common conductive member 160 is between the first active region 110A and the second active region 110B from a top view. In some embodiments, the common conductive member 160 is substantially disposed between the NMOS transistor 130A and the PMOS transistor 130B. In some embodiments, the NMOS transistor 130A and the PMOS transistor 130B are electrically coupled to the common conductive member 160. In some embodiments, the first conductive member 140, the second conductive member 150 and the common conductive member 160 are formed of a conductive material, such as copper (Cu), tungsten (W), aluminum (Al), titanium (Ti), tantalum (Ta), alloys thereof, or the like.

Figure 2:
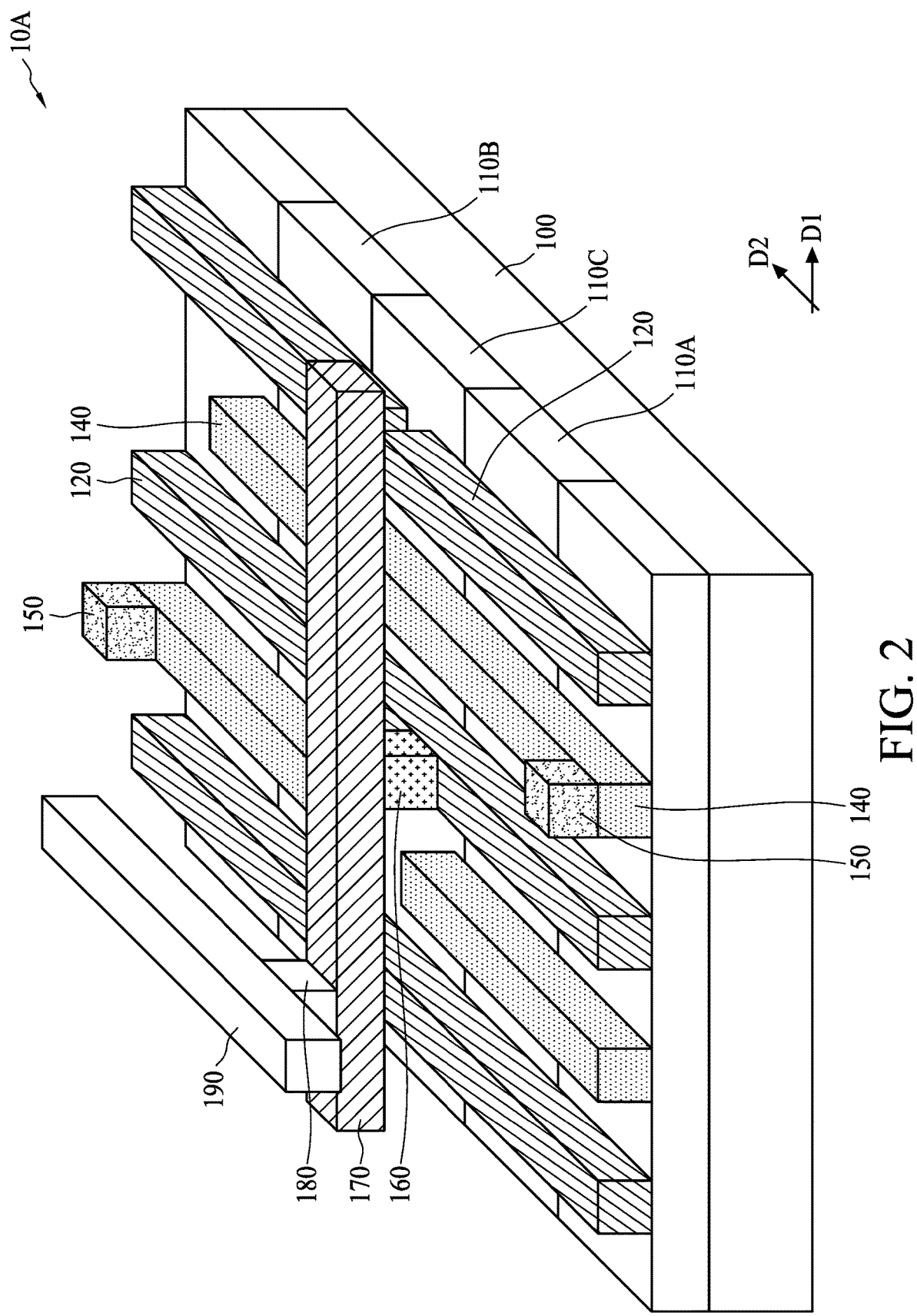
FIG. 2 is a schematic perspective view of a portion of the semiconductor device in FIG. 1, in accordance with some embodiments of the present disclosure.

FIG. 2 is a schematic perspective view of a portion of the semiconductor device 10 in FIG. 1, as indicated by an arrow 10A in FIG. 1, in accordance with some embodiments of the present disclosure. In some embodiments, the first conductive member 140 is a gate-layer conductive line disposed adjacent to the gate electrode 120. That is, the first conductive member 140 and the gate electrode 120 are located at a same layer level over the first active region 110A or the second active region 110B. In some embodiments, the second conductive member 150 and the common conductive member 160 are located at the same layer level over the gate electrode 120 and the first conductive member 140.

In some embodiments, a total height of the common conductive member 160 and the gate electrode 120 is substantially same as a total height of the first conductive member 140 and the second conductive member 150. In some embodiments, a first metal line 170 is disposed over the common conductive member 160. The first metal line 170 extends along the first direction D1 over the gate electrode 120. Another first metal line 170 may also be disposed over the second conductive member 150 but is not shown for clarity. In some embodiments, the first metal line 170 is electrically coupled to the common conductive member 160 or the second conductive member 150. In some embodiments, a conductive via 180 is disposed on the first metal line 170, and a second metal line 190 is disposed over the conductive via 180. In some embodiments, the second metal line 190 is perpendicular to the first metal line 170 from a top view. In other embodiments, the second metal line 190 is parallel to the first metal line 170 from a top view.

The first metal line 170, the conductive via 180 and the second metal line 190 are electrically connected. Although not explicitly shown, a dielectric material is disposed over the substrate 100 to surround the above-mentioned components. In some embodiments, the first metal line 170, the conductive via 180 and the second metal line 190 are electrically connected to a first power supply (not shown) or a second power supply (not shown). In some embodiments, the first power supply is a power-supply voltage ($V_{dd}$) and the second power supply is a ground voltage ($V_{ss}$). In some embodiments, the gate electrode 120 and the common conductive member 160 are electrically coupled to the first power supply or the second power supply.

Figure 3:
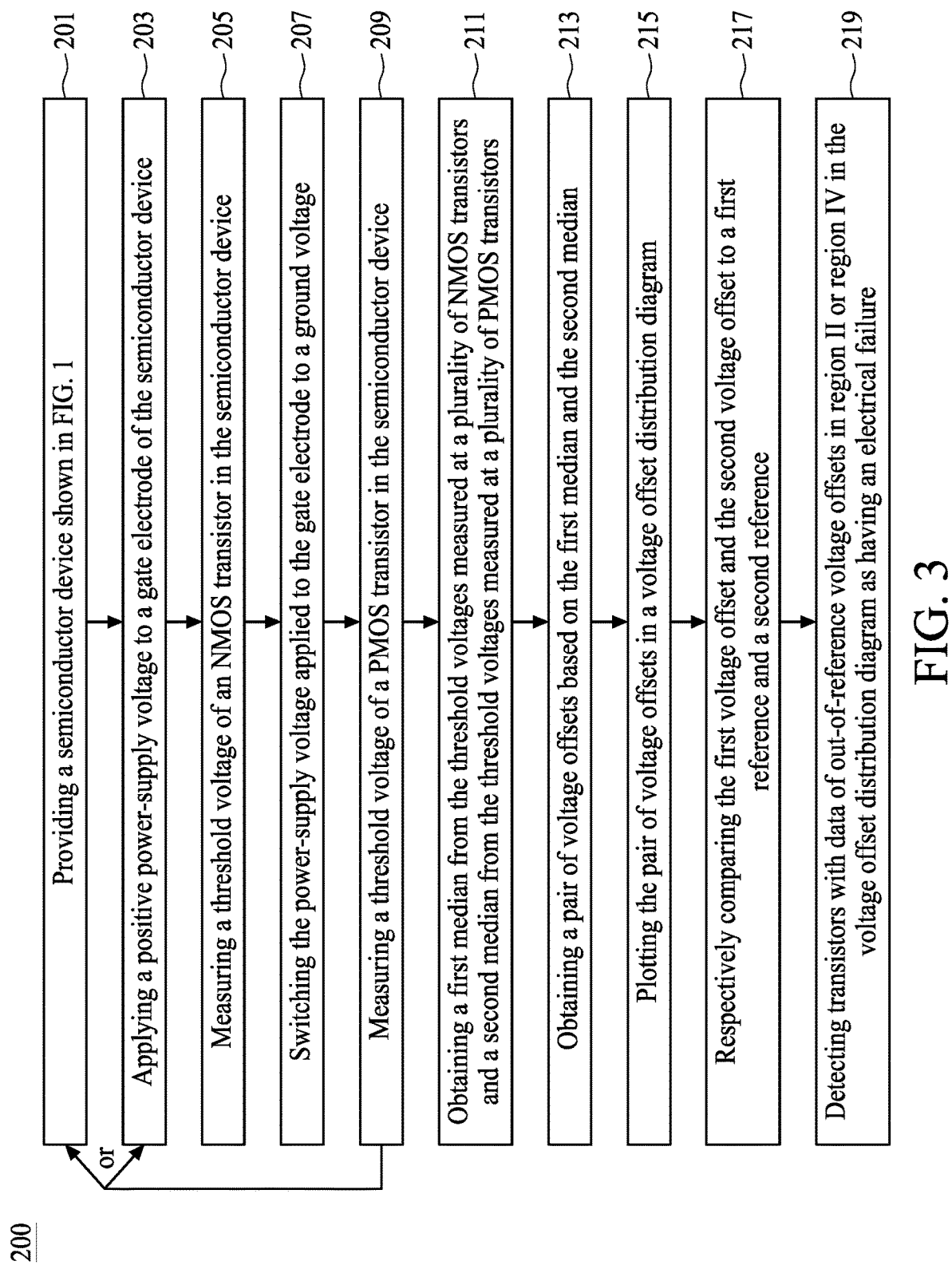
FIG. 3 is a flow diagram showing a method of measuring the semiconductor device in FIG. 1, in accordance with some embodiments of the present disclosure.

FIG. 3 is a flow diagram showing a method 200 of measuring a semiconductor device, in accordance with some embodiments of the present disclosure. FIGS. 4 to 12 are schematic views illustrating sequential operations and related diagrams of the method 200 in FIG. 3, in accordance with some embodiments of the present disclosure.

In operation 201, a semiconductor device 10 in FIG. 1 is provided, as shown in FIG. 3. Some descriptions of components and their functions related to the semiconductor device 10 in FIG. 1 or 2 are omitted here for brevity. In some embodiments, an NMOS transistor 130A and a PMOS transistor 130B disposed adjacent to the NMOS transistor 130A are provided. In such embodiments, the NMOS transistor 130A and the PMOS transistor 130B share a gate electrode 120. The gate electrode 120 is common to the NMOS transistor 130A and the PMOS transistor 130B. In some embodiments, a common conductive member 160 is disposed on the gate electrode 120 and between the NMOS transistor 130A and the PMOS transistor 130B. In some embodiments, the common conductive member 160 is electrically coupled to the NMOS transistor 130A and the PMOS transistor 130B.

Figure 4:
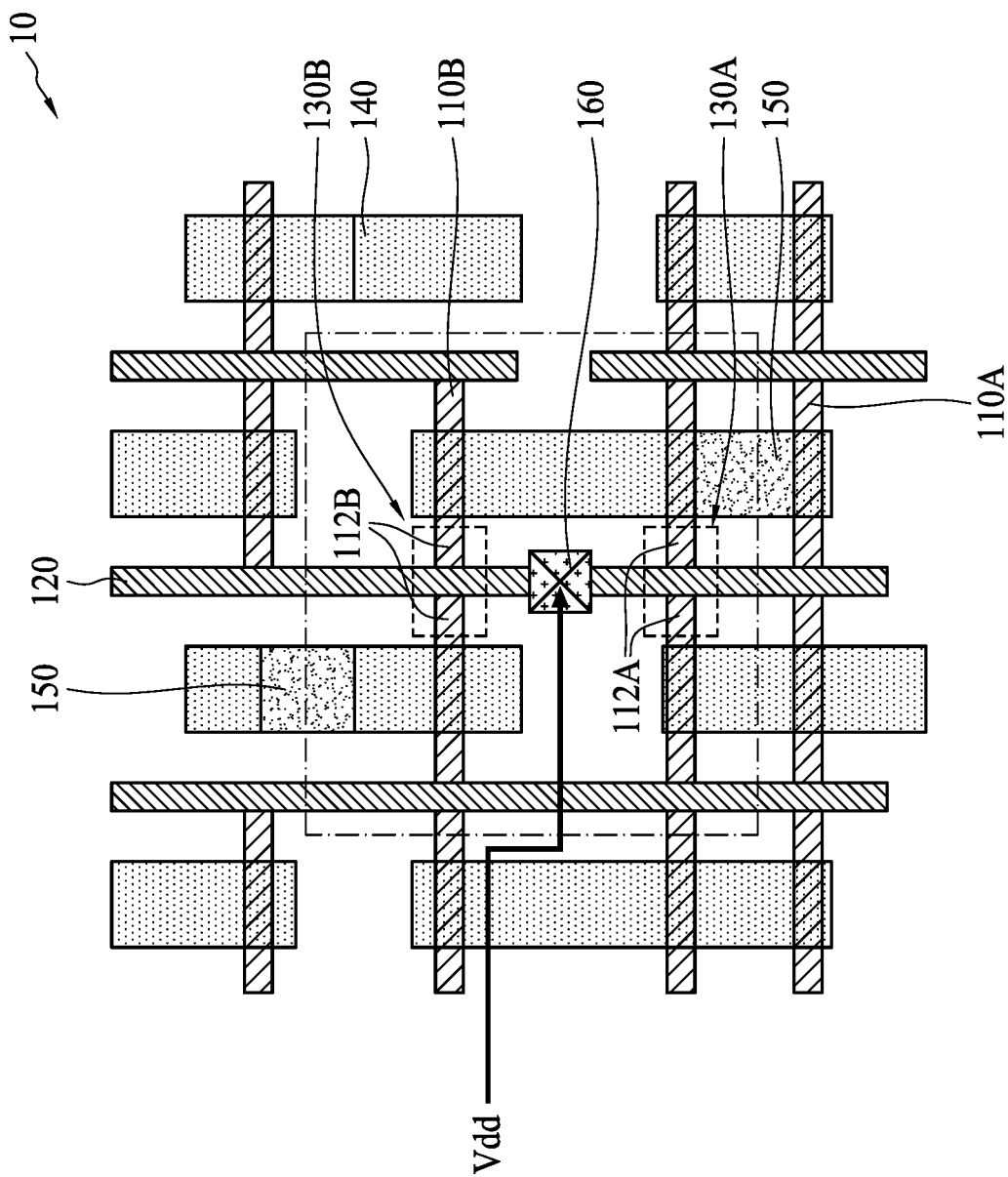
FIGS. 4 to 12 are schematic views illustrating sequential operations and related diagrams of the method in FIG. 3, in accordance with some embodiments of the present disclosure.

In operation 203, a positive power-supply voltage ($V_{dd}$>0) is applied to the gate electrode 120 of the semiconductor device 10, as shown in FIG. 3. Referring to FIG. 4, the positive power-supply voltage ($V_{dd}$>0) is applied to the common conductive member 160 of the semiconductor device 10. The gate electrode 120 is electrically coupled to the common conductive member 160, and further to the first metal line 170, the conductive via 180 and the second metal line 190 above the common conductive member 160, as shown in FIG. 2. In some embodiments, the power-supply voltage applied to the gate electrode 120 is applied through the common conductive member 160. In some embodiments, the power-supply voltage applied to the gate electrode 120 is applied through the common conductive member 160, the first metal line 170, the conductive via 180 and the second metal line 190.

Figure 5:
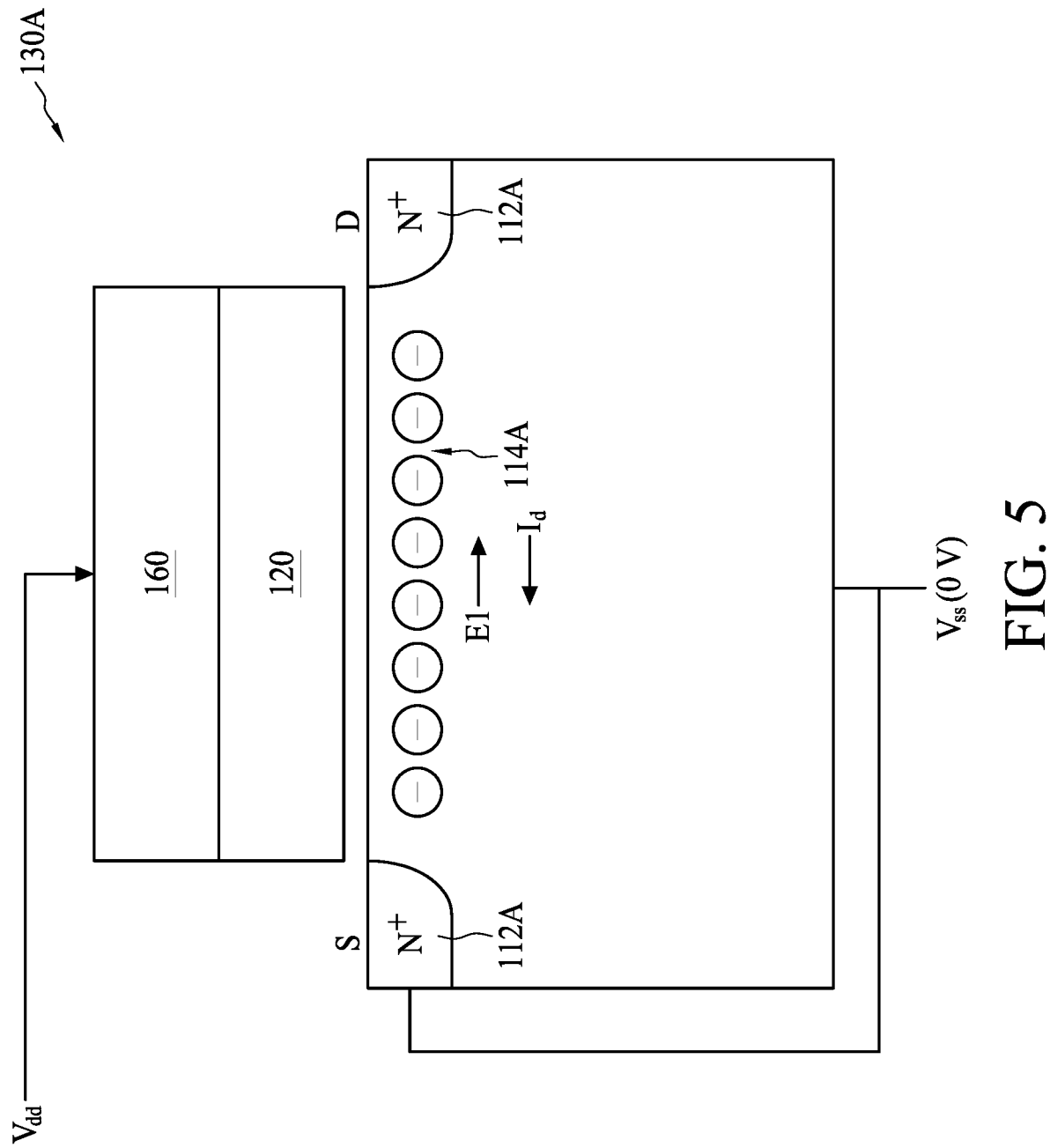

Referring to FIG. 5, the positive power-supply voltage is applied as the gate voltage to the NMOS transistor 130A ($V_g=V_{dd}$>0). In order to turn on the NMOS transistor 130A, a gate-source voltage ($V_{gs}$) needs to be greater than a threshold voltage ($V_{th}$) of the NMOS transistor 130A. Therefore, the source terminal of the NMOS transistor 130A is connected to the lowest voltage in the circuit, i.e., the ground voltage ($V_s=V_{ss}=0V$) to result in the gate voltage ($V_g$) greater than the source voltage ($V_s$), and thus the gate-source voltage ($V_{gs}$) of the NMOS transistor 130A becomes positive. Because the source terminal is grounded, the gate-source voltage ($V_{gs}$) is equal to the gate voltage ($V_g$) and the power-supply voltage ($V_{dd}$), that is $V_{gs}=V_g=V_{dd}$.

When the positive power-supply voltage ($V_{dd}$>0) is applied, the gate-source voltage ($V_{gs}$) is less than a threshold voltage ($V_{th}$) required to turn on the NMOS transistor 130A ($0<V_{gs}<V_{th}$). As the power-supply voltage continues to increase, the gate voltage ($V_g$) and the gate-source voltage ($V_{gs}$) also increase. At such time, an electron concentration between the first second S/D region 112A increases and an inversion layer of electrons 114A is gradually formed at the channel region to connect the source terminal and the drain terminal. When the gate-source voltage ($V_{gs}$) of the NMOS transistor 130A is greater than the threshold voltage ($0<V_{th}<V_{gs}$), the NMOS transistor 130A will be turned on. At such time, electrons (negative charges) flow from the source terminal to the drain terminal through the inversion layer of electrons 114A below the gate electrode 120.

In some embodiments, when the power-supply voltage is applied as the gate voltage, the NMOS transistor 130A is turned on and the PMOS transistor 130B is turned off. A drain-source voltage ($V_{ds}$) controls the electric field that moves the electrons from the source terminal to the drain terminal. A drain current ($I_d$) (also referred to as a drain-to-source current ($I_{ds}$)), flows from the drain terminal to the source terminal, i.e., in a direction opposite to that of the electrons. The gate-source voltage ($V_{gs}$) controls an amount of electrons carrying the drain current in the inversion layer of electrons 114A.

In operation 205, the threshold voltage ($V_{th}$) of the NMOS transistor 130A in the semiconductor device 10 is measured, as shown in FIG. 3. In some embodiments, the threshold voltage ($V_{th}$) of the NMOS transistor 130A can be determined based on the power-supply voltage. The threshold voltage ($V_{th}$) is determined by gradually increasing the power-supply voltage applied to the gate electrode 120 such that the gate-source voltage ($V_{gs}$) of the NMOS transistor 130A is greater than the threshold voltage ($V_{th}$) required to turn on the NMOS transistor 130A.

Figure 6:
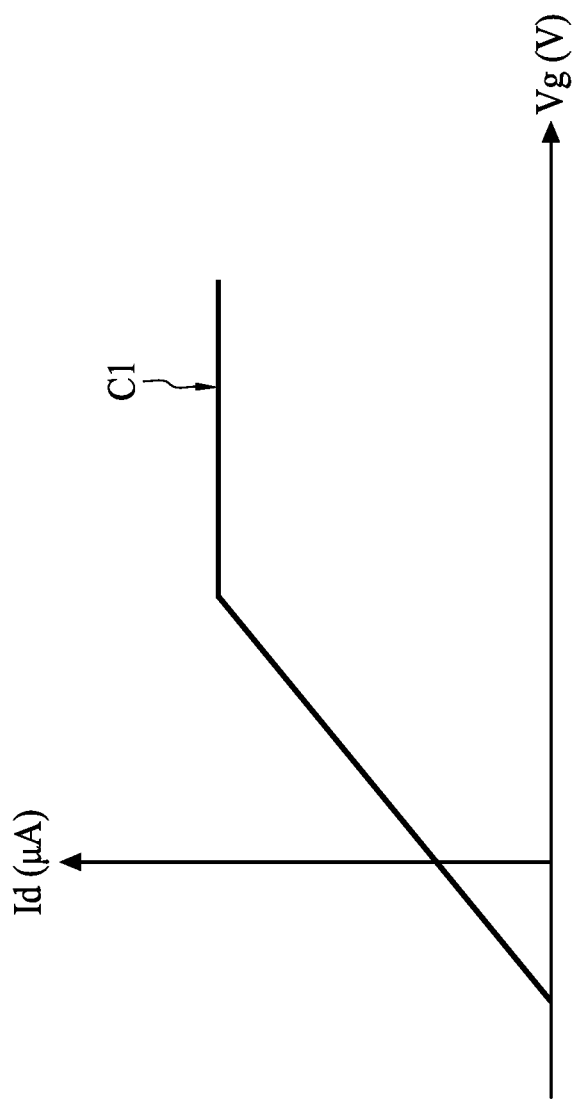

FIG. 6 is a schematic diagram depicting a current-voltage (I-V) characteristic curve of the NMOS transistor 130A, in accordance with some embodiments of the present disclosure. The gate voltage ($V_g$) is plotted on the x axis, and the drain current ($I_d$) is plotted on the y axis. The I-V characteristic curve can be used to analyze an electrical performance of the NMOS transistor 130A. For example, a curve C1 illustrates the NMOS transistor 130A's output drain current under a given gate voltage. The curve C1 follows the relation $I_{dsat} \propto (V_{gs}-V_{th})^2$, in which $I_{dsat}$ is a saturation drain current.

Figure 7:
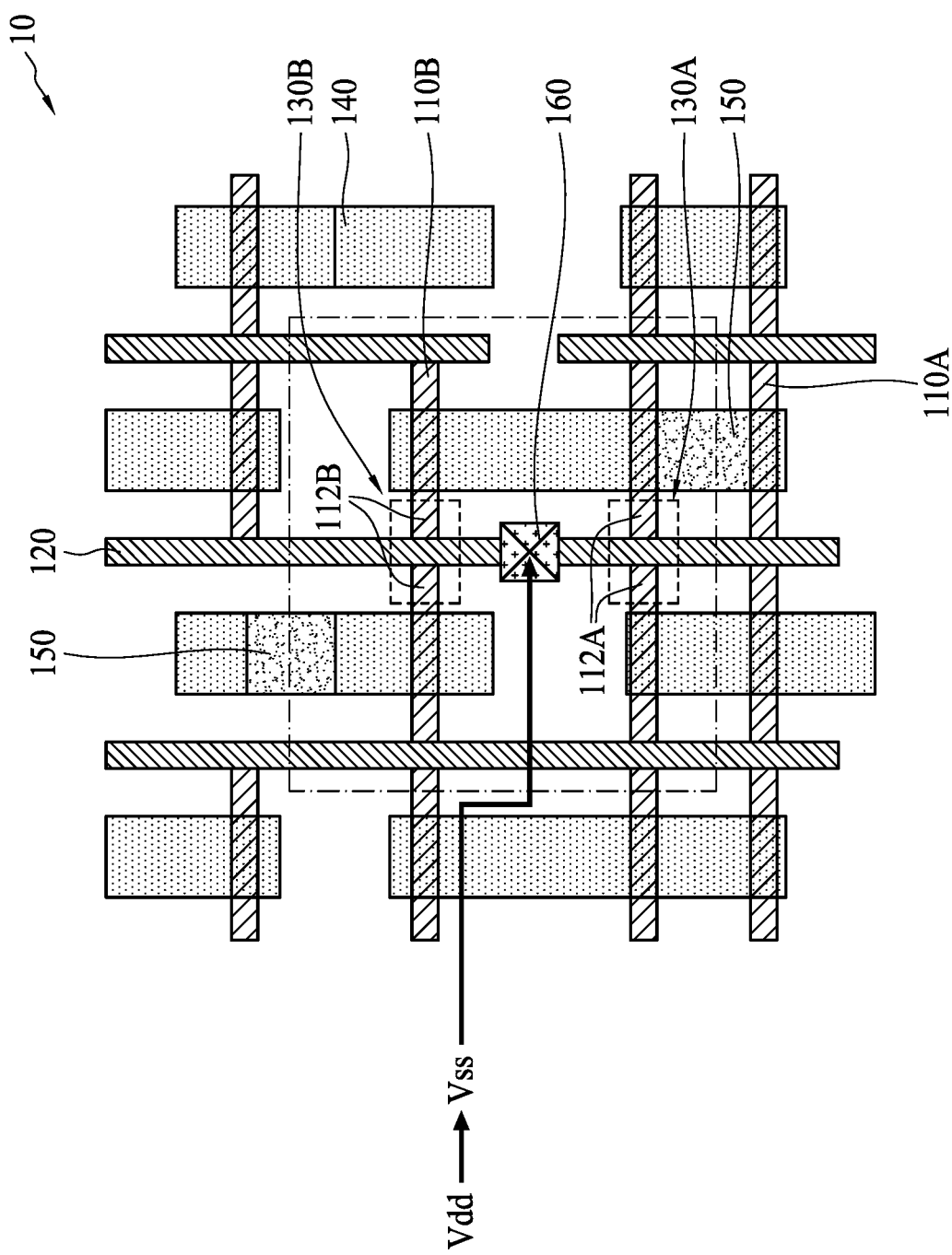

In operation 207, the power-supply voltage applied to the gate electrode 120 is switched to the ground voltage ($V_{ss}$), as shown in FIG. 3. Referring to FIG. 7, the ground voltage ($V_{ss}$) is applied to the common conductive member 160 of the semiconductor device 10. At such time, the NMOS transistor 130A is turned off because the positive power-supply voltage is no longer applied to the gate electrode 120.

Figure 8:
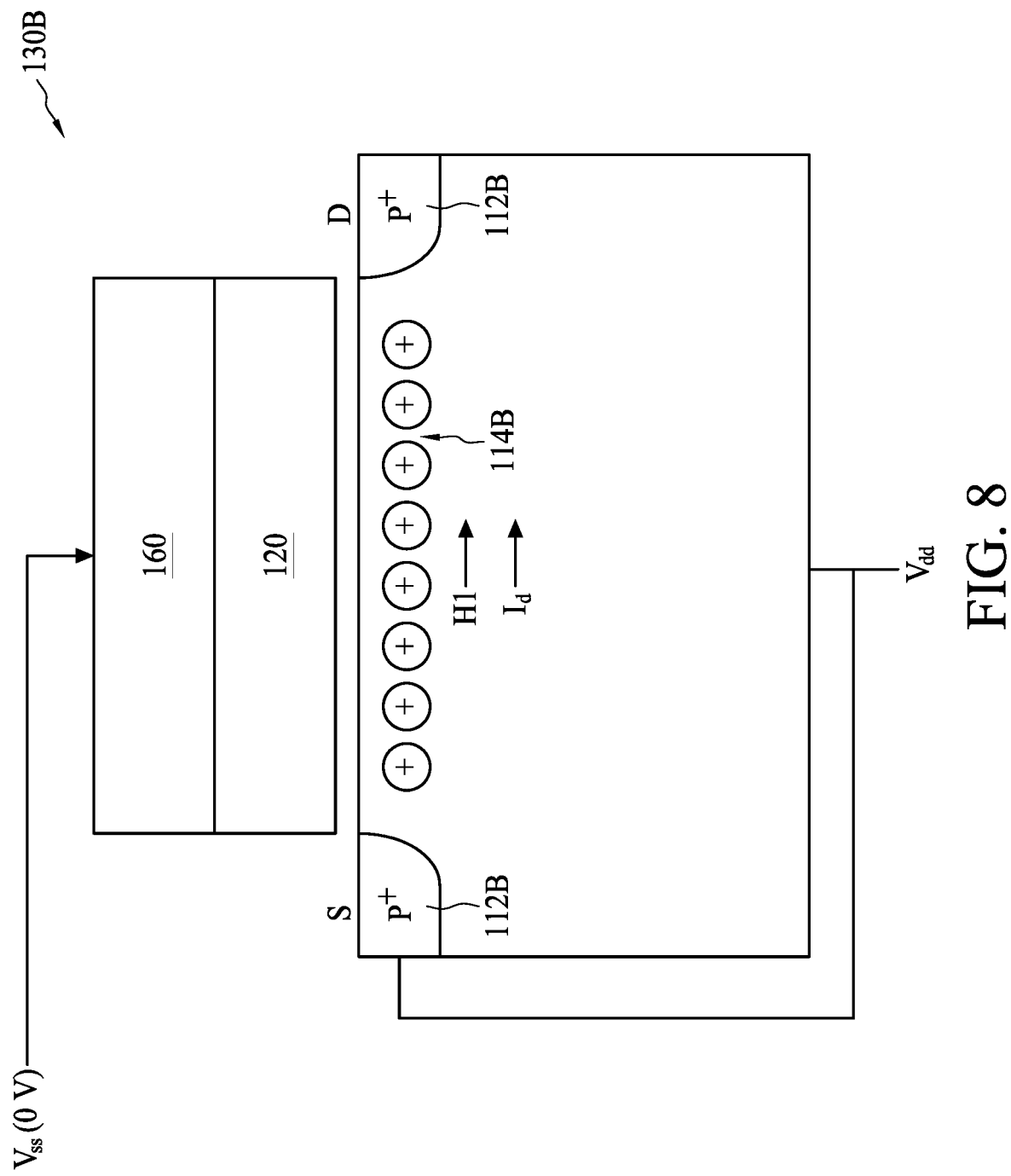

Referring to FIG. 8, the gate voltage applied to the PMOS transistor 130B ($V_g=V_{ss}=0$) is switched to the ground voltage. In order to turn on the PMOS transistor 130B, a gate-source voltage ($V_{gs}$) needs to be less than a threshold voltage ($V_{th}$) of the PMOS transistor 130B. Therefore, the source terminal and the bulk of the PMOS transistor 130B are connected to a positive power-supply voltage ($V_s=V_{dd}>0$) to result in the gate voltage ($V_g$) less than the source voltage ($V_{ss}$), and thus the gate-source voltage ($V_{gs}$) of the PMOS transistor 130B becomes negative. When the gate-source voltage ($V_{gs}$) of the PMOS transistor 130B is less than the threshold voltage ($V_{gs}<V_{th}<0$), the PMOS transistor 130B will be turned on.

When the PMOS transistor 130B is turned on, hole concentration between the second S/D regions 112B is high. An inversion layer of holes 114B is formed at the channel region to connect the source terminal to the drain terminal. Therefore, holes (positive charges) flow from the source terminal to the drain terminal through the inversion layer of holes 114B below the gate electrode 120, and the drain current flows in a same direction. In some embodiments, the ground voltage applied to the gate electrode 120 is applied through the common conductive member 160. In some embodiments, the ground voltage applied to the gate electrode 120 is applied through the common conductive member 160, the first metal line 170, the conductive via 180 and the second metal line 190. In some embodiments, when the ground voltage is applied as the gate voltage, the PMOS transistor 130B is turned on and the NMOS transistor 130A is turned off.

In operation 209, the threshold voltage ($V_{th}$) of the PMOS transistor 130B in the semiconductor device 10 is measured, as shown in FIG. 3. In some embodiments, the threshold voltage ($V_{th}$) of the PMOS transistor 130B can be determined based on the power-supply voltage. The threshold voltage ($V_{th}$) is determined by gradually increasing the power-supply voltage applied to the source terminal such that the gate-source voltage ($V_{gs}$) of the PMOS transistor 130B is less than the threshold voltage ($V_{th}$) required to turn on the PMOS transistor 130B. Therefore, threshold voltages separately measured at the NMOS transistor 130A and the PMOS transistor 130B can be obtained.

Figure 9:
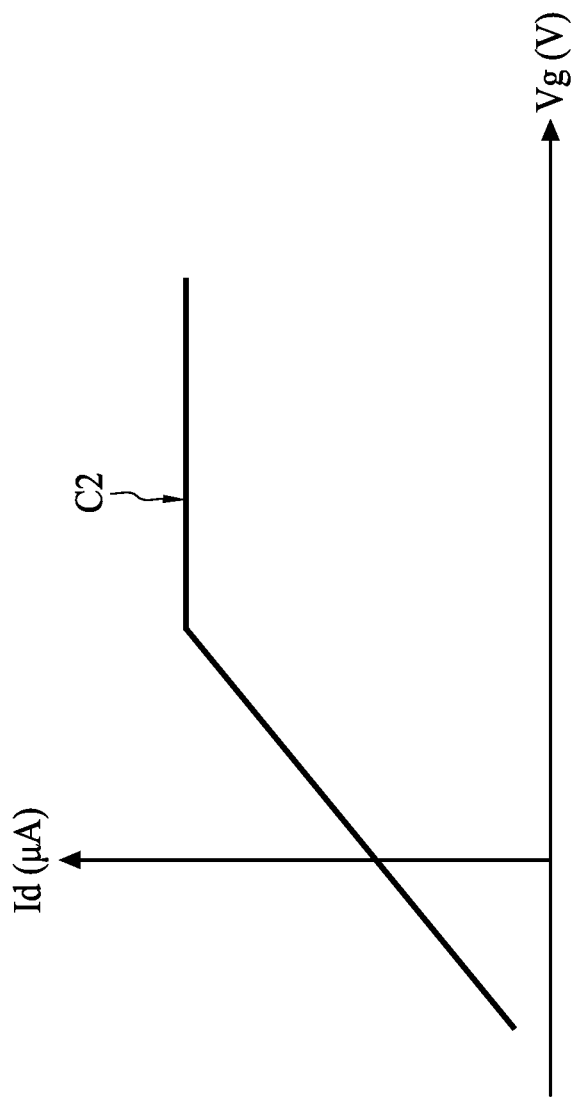

FIG. 9 is a schematic diagram depicting a current-voltage (I-V) characteristic curve of the PMOS transistor 130B, in accordance with some embodiments of the present disclosure. The I-V characteristic curve can be used to analyze an electrical performance of the PMOS transistor 130B. For example, a curve C2 illustrates the PMOS transistor 130B's output drain current under a given gate voltage.

In some embodiments, the operations 203 to 209 can be repeated on another combination of NMOS transistor and PMOS transistor having a shared gate electrode in the semiconductor device 10. Alternatively, in some embodiments, the operations 201 to 209 can be performed on other semiconductor devices. Therefore, after a plurality of NMOS transistors and a plurality of PMOS transistors are measured, a database of multiple pairs of threshold voltages can be obtained.

In operation 211, a first median is obtained from the threshold voltages ($V_{th}$) measured at the plurality of NMOS transistors, and a second median is obtained from the threshold voltages ($V_{th}$) measured at the plurality of PMOS transistors, as shown in FIG. 3. In some embodiments, the first median is referred to as a first reference threshold voltage, and the second median is referred to as a second reference threshold voltage.

Figure 10:
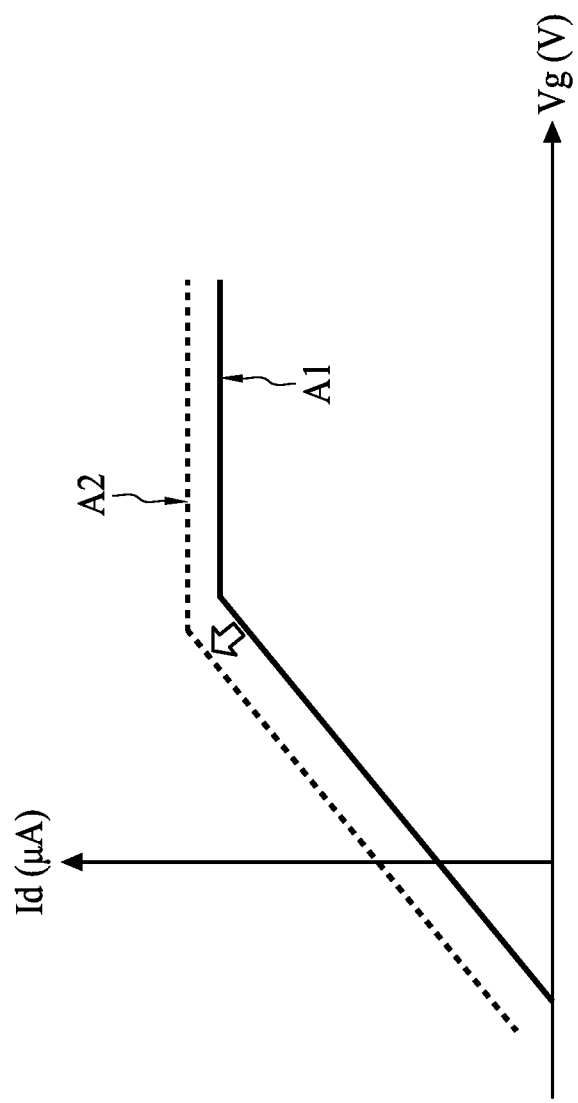
Figure 11:
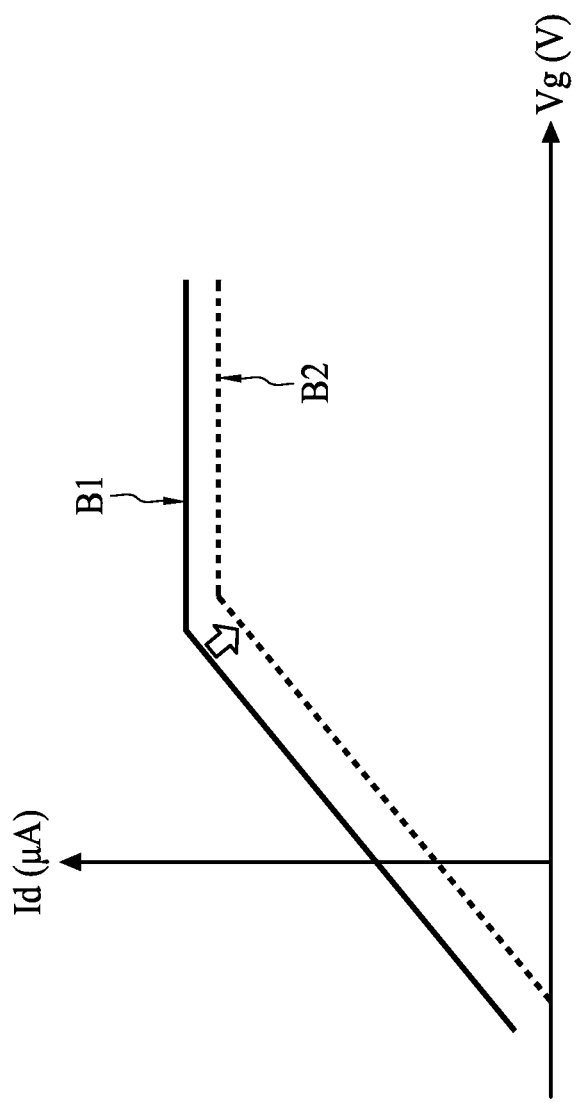

FIG. 10 is a schematic diagram depicting an I-V characteristic curve of the NMOS transistor having the first median of threshold voltage and an I-V characteristic curve of an abnormal NMOS transistor, in accordance with some embodiments of the present disclosure. In some embodiments, the NMOS transistor having the first median of threshold voltage may be treated as a normal NMOS transistor. FIG. 11 is a schematic diagram depicting an I-V characteristic curve of the PMOS transistor having the second median of threshold voltage and an I-V characteristic curve of an abnormal PMOS transistor, in accordance with some embodiments of the present disclosure. In some embodiments, the PMOS transistor having the second median of threshold voltage may be treated as a normal NMOS transistor. Referring to FIG. 10, a curve A1 represents a normal NMOS transistor's output drain current under a given gate voltage. The curve A1 is used as an indication for comparing an I-V characteristic curve of an NMOS transistor under test. For example, a curve A2 characterizing an NMOS transistor under test is shown in FIG. 10. Since the curve A2 deviates from the curve A1 and shows a greater NMOS $I_{dsat}$, the NMOS transistor under test may suffer from an electrical problem caused by factors such as a metal-depositing problem at its metal gate. Referring to FIG. 11, a curve B1 represents a normal PMOS transistor's output drain current under a given gate voltage. The curve B1 is used as an indication for comparing an I-V characteristic curve of a PMOS transistor under test. For example, a curve B2 characterizing a PMOS transistor under test is shown in FIG. 11. Since the curve B2 deviates from the curve B1 and shows a weaker PMOS $I_{dsat}$, the PMOS transistor under test may also suffer from an electrical problem caused by factors such as a metal-depositing problem at its metal gate.

In operation 213, a pair of voltage offsets is obtained based on the first median and the second median, as shown in FIG. 3. In some embodiments, the pair of voltage offsets includes a first voltage offset and a second voltage offset. The first voltage offset is a first difference between one threshold voltage measured at one of the NMOS transistors and the first median (the first reference threshold voltage).

In some embodiments, the first difference is obtained by subtracting the first reference threshold voltage from the threshold voltage measured at one of the NMOS transistors. The second voltage offset is a second difference between the threshold voltage measured at the PMOS transistor sharing a same gate electrode as the above-mentioned NMOS transistor and the second median (the second reference threshold voltage).

In some embodiments, the second difference is obtained by subtracting the second reference threshold voltage from the threshold voltage measured at one of the PMOS transistors. In some embodiments, the first voltage offset is determined based on the performance of an NMOS transistor and the second voltage offset is determined based on the performance of a PMOS transistor sharing the same gate electrode as the NMOS transistor. In some embodiments, the first voltage offset and the second voltage offset are used to analyze a performance of common conductive member electrode.

Figure 12:
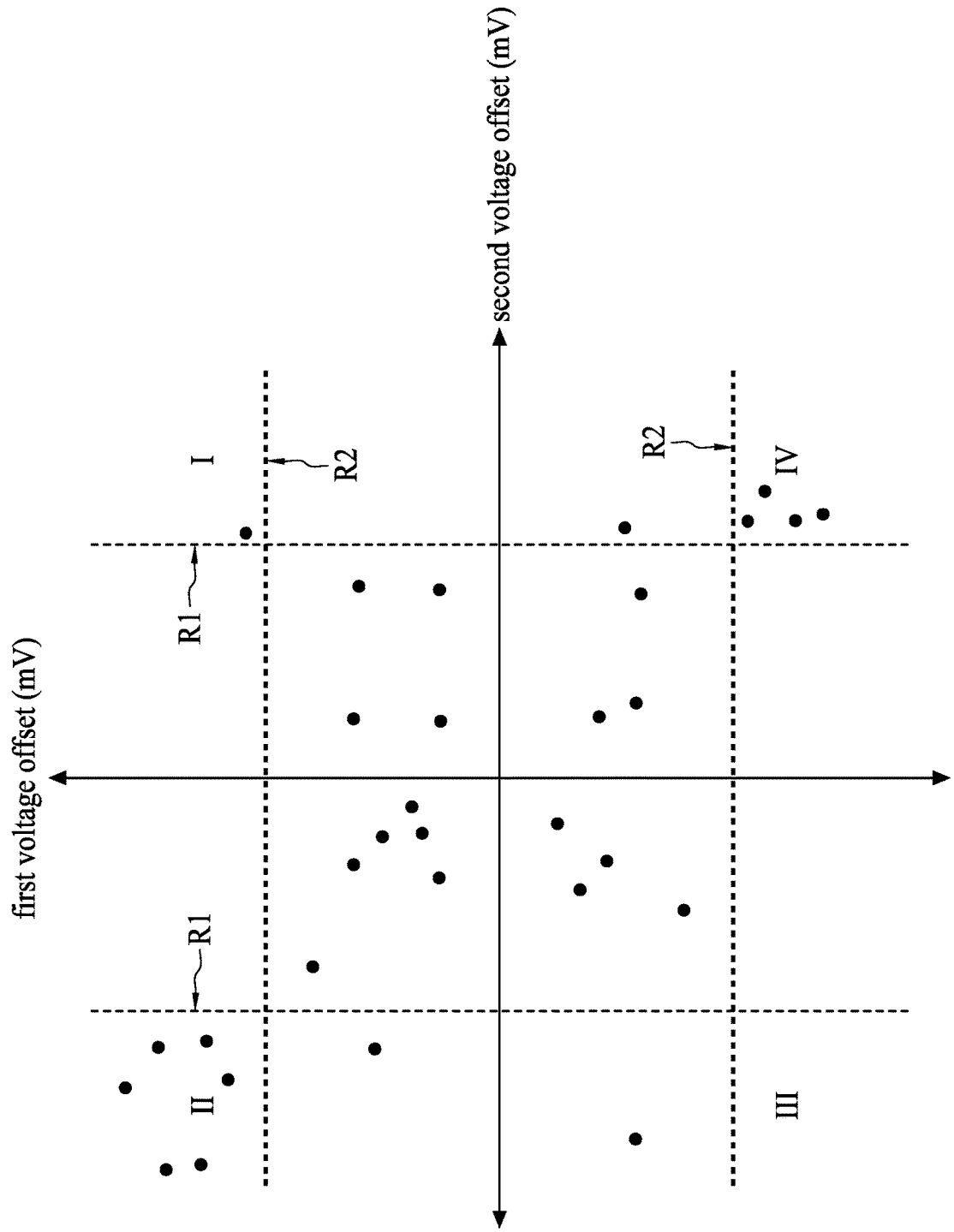

In operation 215, the pair of voltage offsets are plotted in a voltage offset distribution diagram, as shown in FIG. 3. FIG. 12 illustrates the voltage offset distribution diagram in which the y axis is the first voltage offset and the x axis is the second voltage offset, in accordance with some embodiments of the present disclosure. In some embodiments, multiple sets of voltage offsets can be plotted in the voltage offset distribution diagram, as shown in FIG. 12.

In operation 217, the first voltage offset and the second voltage offset are respectively compared to a first reference R1 and a second reference R2, as shown in FIG. 3. In some embodiments, the first reference R1 and the second reference R2 are ranges of voltage offset defined according to a statistical result of product performance such as electrical behaviors. In some embodiments, an out-of-reference voltage offset gives an indication that the shared gate electrode might have a high probability of electrical failure. In some embodiments, according to a positive or negative value of the out-of-reference voltage offset, the diagram in FIG. 12 can be divided into four regions by the first reference R1 and the second reference R2. The four regions include a positive first voltage offset with a positive second voltage offset, a positive first voltage offset with a negative second voltage offset, a negative first voltage offset with a negative second voltage offset, and a negative first voltage offset with a positive second voltage offset, which are respectively referred to as region I, region II, region III and region IV in FIG. 12.

In operation 219, transistors with data of out-of-reference voltage offsets in region II or region IV in the voltage offset distribution diagram are detected as having an electrical failure, as shown in FIG. 3. In some embodiments, a transistor having a positive out-of-reference first voltage offset with a negative out-of-reference second voltage offset or a negative out-of-reference first voltage offset with a positive out-of-reference second voltage offset is suspected as having an electrical failure. Since the method 200 is used to analyze a gate electrode shared by an NMOS transistor and a PMOS transistor based on a first voltage offset measured at the NMOS transistor and a second voltage offset measured at the PMOS transistor, in some embodiments, the electrical failure can be determined to have arisen from a problem caused by the shared gate electrode. Further, the electrical failure caused by metal-depositing issues can be determined. In some embodiments, the location of the problematic gate electrode can be precisely pinpointed.

The present disclosure is directed to a method for analyzing an electrical behavior of a gate electrode in a semiconductor device. In addition, the semiconductor device is designed using a layout for performing the analytical method. An NMOS transistor and a PMOS transistor adjacent to the NMOS transistor are provided. The NMOS transistor and the PMOS transistor have a shared gate electrode with a common conductive member disposed thereon. By applying a power-supply voltage to the shared gate electrode through the common conductive member, the NMOS transistor is turned on and the PMOS transistor is turned off. After an electrical performance of the NMOS transistor is obtained, the power-supply voltage is switched to a ground voltage to be applied to the shared gate electrode. The NMOS transistor is therefore turned off and the PMOS transistor is turned on. An electrical performance of the PMOS transistor is then obtained. Using statistical methods, electrical performances of the NMOS transistor and the PMOS transistor are converted into coordinate points in a voltage offset distribution diagram. With the use of the two-coordinate diagram, electrical problems that were undetectable in a routine WAT analysis can be detected. In addition, the method can be used as a routine process control monitor (PCM) item.

One aspect of the present disclosure provides a method of analyzing a semiconductor device. The method includes providing a first transistor, a second transistor disposed adjacent to the first transistor, and a gate electrode common to the first transistor and the second transistor; connecting a power-supply voltage ($V_{dd}$) to the gate electrode to turn on the first transistor, determining a first threshold voltage ($V_{th}$) based on the power-supply voltage; switching the power-supply voltage to a ground voltage ($V_{ss}$); connecting the ground voltage to the gate electrode to turn on the second transistor, and determining a second threshold voltage ($V_{th}$) based on the ground voltage.

In some embodiments, the power-supply voltage or the ground voltage is supplied to the gate electrode through a common conductive member disposed on the gate electrode and between the first transistor and the second transistor.

In some embodiments, the method further includes subtracting a first reference threshold voltage from the first threshold voltage to obtain a first voltage offset, and subtracting a second reference threshold voltage from the second threshold voltage to obtain a second voltage offset.

In some embodiments, the method further includes analyzing the gate electrode based on the first voltage offset and the second voltage offset.

In some embodiments, the method further includes comparing the first voltage offset with the second voltage offset.

One aspect of the present disclosure provides another method of analyzing a semiconductor device. The method includes providing an NMOS transistor, a PMOS transistor and a gate electrode common to the NMOS transistor and the PMOS transistor; forming a common conductive member on the gate electrode and between the NMOS transistor and the PMOS transistor, coupling a gate voltage to the common conductive member; applying a power-supply voltage as the gate voltage to turn on the NMOS transistor, measuring a first threshold voltage of the NMOS transistor based on the gate voltage; switching the power-supply voltage to a ground voltage as the gate voltage to turn on the PMOS transistor; and measuring a second threshold voltage of the PMOS transistor based on the gate voltage.

In some embodiments, the first threshold voltage and the second threshold voltage are measured via the gate electrode.

In some embodiments, the NMOS transistor is turned off when the ground voltage is applied as the gate voltage, and the PMOS transistor is turned off when the power-supply voltage is applied as the gate voltage.

Another aspect of the present disclosure provides a semiconductor device. The semiconductor device includes a substrate. A first active region having a first conductive type extends along a first direction on the substrate. A second active region having a second conductive type opposite to the first conductive type extends along the first direction on the substrate and is separated from the first active region by an isolation structure. A gate electrode extends along a second direction substantially perpendicular to the first direction over the first active region, the isolation structure and the second active region. A common conductive member is disposed on the gate electrode and between the first active region and the second active region.

In some embodiments, the common conductive member is coupled to a power-supply voltage or a ground voltage.

In some embodiments, a portion of the first active region on two sides of the gate electrode from a top view is a first source/drain region, and a portion of the second active region on two sides of the gate electrode from a top view is a second source/drain region.

In some embodiments, the first conductive type is P type, and the second conductive type is N type.

In some embodiments, the first source/drain region and the gate electrode form an NMOS transistor, and the second source/drain region and the gate electrode form a PMOS transistor.

In some embodiments, the gate electrode is common to the NMOS transistor and the PMOS transistor.

In some embodiments, the NMOS transistor and the PMOS transistor are coupled to the common conductive member.

In some embodiments, the semiconductor device further includes a plurality of first conductive members respectively disposed in the first active region and the second active region.

In some embodiments, the plurality of first conductive members extend along the second direction and parallel to each other and are spaced away from the gate electrode.

In some embodiments, the plurality of first conductive members are disposed on opposite sides of the gate electrode.

In some embodiments, the semiconductor device further includes a second conductive member disposed on at least one of the plurality of first conductive members.

In some embodiments, a total height of the common conductive member and the gate electrode is substantially same as a total height of one of the plurality of first conductive members and one of the plurality of the second conductive members.

The foregoing outlines features of several embodiments such that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

What is claimed is:

1. A method of analyzing a semiconductor device, comprising:
   providing a first transistor, a second transistor disposed adjacent to the first transistor, and a gate electrode common to the first transistor and the second transistor;
   connecting a power-supply voltage to the gate electrode to turn on the first transistor;
   determining a first threshold voltage based on the power-supply voltage;
   switching the power-supply voltage to a ground voltage;
   connecting the ground voltage to the gate electrode to turn on the second transistor;
   determining a second threshold voltage based on the ground voltage;
   comparing the first threshold voltage with a first reference threshold voltage; and
   comparing the second threshold voltage with a second reference threshold voltage, wherein an electrical problem of the gate electrode is detected if the first threshold voltage is greater than the first reference threshold and the second threshold voltage is less than the second reference threshold voltage.

2. The method of claim 1, wherein the power-supply voltage or the ground voltage is supplied to the gate electrode through a common conductive member disposed on the gate electrode and between the first transistor and the second transistor.

3. The method of claim 1, further comprising:
   subtracting the first reference threshold voltage from the first threshold voltage to obtain a first voltage offset; and
   subtracting the second reference threshold voltage from the second threshold voltage to obtain a second voltage offset.

4. The method of claim 3, further comprising analyzing the gate electrode based on the first voltage offset and the second voltage offset.

5. The method of claim 3, further comprising comparing the first voltage offset with the second voltage offset.

6. A method of analyzing a semiconductor device, comprising:
   providing an NMOS transistor, a PMOS transistor, and a gate electrode common to the NMOS transistor and the PMOS transistor;
   forming a common conductive member on the gate electrode and between the NMOS transistor and the PMOS transistor;

coupling a gate voltage to the common conductive member;

applying a power-supply voltage as the gate voltage to turn on the NMOS transistor;

measuring a first threshold voltage of the NMOS transistor based on the gate voltage;

switching the power-supply voltage to a ground voltage as the gate voltage to turn on the PMOS transistor;

measuring a second threshold voltage of the PMOS transistor based on the gate voltage;

comparing a first drain current corresponding to the first threshold voltage with an output drain current of a normal NMOS transistor; and comparing a second drain current corresponding to the second threshold voltage with an output drain current of a normal PMOS transistor, wherein an electrical problem of the gate electrode is detected if the first drain current is greater than the output drain current of the normal NMOS transistor and the second drain current is less than the output drain current of the normal PMOS transistor.

7. The method of claim 6, wherein the first threshold voltage and the second threshold voltage are measured via the gate electrode.

8. The method of claim 6, wherein the NMOS transistor is turned off when the ground voltage is applied as the gate voltage, and the PMOS transistor is turned off when the power-supply voltage is applied as the gate voltage.

9. A semiconductor device, comprising:
a substrate;
a first active region having a first conductive type and extending along a first direction on the substrate;
a second active region having a second conductive type opposite to the first conductive type, extending along the first direction on the substrate and separated from the first active region by an isolation structure;
a single gate electrode extending along a second direction substantially perpendicular to the first direction over the first active region, the isolation structure and the second active region; and
a common conductive member disposed on the single gate electrode and between the first active region and the second active region;
a first metal line disposed over the common conductive member and extending along the first direction, wherein the first metal line is electrically coupled to the single gate electrode via the common conductive member;
a plurality of first conductive members respectively disposed in the first active region and the second active region; and
a second conductive member disposed on at least one of the plurality of first conductive members, wherein a total height of the common conductive member and the single gate electrode is substantially same as a total height of one of the plurality of first conductive members and the second conductive member.

10. The semiconductor device of claim 9, wherein the common conductive member is coupled to a power-supply voltage or a ground voltage.

11. The semiconductor device of claim 9, wherein a portion of the first active region on two sides of the single gate electrode from a top view is a first source/drain region, and a portion of the second active region on two sides of the gate electrode from a top view is a second source/drain region.

12. The semiconductor device of claim 9, wherein the first conductive type is P type, and the second conductive type is N type.

13. The semiconductor device of claim 11, wherein the first source/drain region and the gate electrode form an NMOS transistor, and the second source/drain region and the gate electrode form a PMOS transistor.

14. The semiconductor device of claim 13, wherein the single gate electrode is common to the NMOS transistor and the PMOS transistor.

15. The semiconductor device of claim 13, wherein the NMOS transistor and the PMOS transistor are coupled to the common conductive member.

16. The semiconductor device of claim 9, wherein the first metal line at least partially overlaps the single gate electrode and the common conductive member from a top view.

17. The semiconductor device of claim 16, wherein the plurality of first conductive members extend along the second direction and parallel to each other and are spaced away from the single gate electrode.

18. The semiconductor device of claim 16, wherein the plurality of first conductive members are disposed on opposite sides of the single gate electrode.

19. The semiconductor device of claim 9, further comprising:
a conductive via disposed on the first metal line; and
a second metal line disposed on the conductive via.

20. The semiconductor device of claim 19, wherein the second metal line extends along the second direction.

* * * * *